United States Patent [19]

Jeuch et al.

[11] Patent Number: 4,939,100

[45] Date of Patent: Jul. 3, 1990

[54] PROCESS FOR THE PRODUCTION OF A MIS TRANSISTOR WITH A RAISED SUBSTRATE/GATE DIELECTRIC INTERFACE END

[75] Inventors: Pierre Jeuch, Seyssins; Jean-Jacques Niez, Grenoble, both of France

[73] Assignee: Commissariat a l'energie Atomique, Paris, France

[21] Appl. No.: 284,540

[22] Filed: Dec. 15, 1988

[30] Foreign Application Priority Data

Dec. 18, 1987 [FR] France ................................ 87 17725

[51] Int. Cl.$^5$ .......................................... H01L 21/302
[52] U.S. Cl. ..................................... 437/44; 437/38; 437/72; 437/203; 357/233
[58] Field of Search ................. 437/40, 41, 44, 50, 437/65, 66, 72, 78, 183, 203, 233, 245, 38; 148/DIG. 26, DIG. 100, DIG. 111, DIG. 143, DIG. 168; 357/55, 23.3, 23.12, 23.13

[56] References Cited

U.S. PATENT DOCUMENTS

| | | | |
|---|---|---|---|
| 4,272,302 | 6/1981 | Jhabvala | 437/38 |
| 4,316,203 | 2/1982 | Tohgei | 148/DIG. 168 |
| 4,393,391 | 7/1983 | Blanchard | 357/23 |
| 4,660,062 | 4/1987 | Nishizawa et al. | 357/23.3 |
| 4,685,196 | 8/1987 | Lee | 437/203 |
| 4,774,206 | 9/1988 | Miller | 437/203 |

FOREIGN PATENT DOCUMENTS 0220542  5/1987  European Pat. Off. .
0146584 11/1979  Japan .
0076571  6/1981  Japan .

OTHER PUBLICATIONS

Ammar, E. S., et al., "UMOS Transistors on (110) Silicon", *IEEE Trans. Elec. Dev. Letts.*, vol. ED-27, No. 5, May 1980, pp. 907-914.
Bampi, et al., "Modified LDD Device Structures for VLSI", *IEEE IEDM Tech. Digest*, 1985, pp. 234-237.
Ikeda, H., "Substrate Current of Submicrometer Buried-Gate MOSFET," *Japanese J. Appl. Phys.*, vol. 24, No. 6, Jun. 1985, pp. L457-L459.
Takeda, E., et al., "New Grooved-Gate MOSFET with Drain Separated from Channel Implanted Region (DSC)", *IEEE Trans. Elect. Dev.*, vol. ED-30, No. 6, Jun. 1983, pp. 681-686.
Nishimatsu, S., et al., "Grooved Gate MOSFET", *Japanses J. Appl. Phys.*, vol. 16 (1977) Supplement 16-1, pp. 179-183.

Primary Examiner—Brian E. Hearn
Assistant Examiner—T. N. Quach
Attorney, Agent, or Firm—Nutter, McClennen & Fish

[57] ABSTRACT

A process for the production of a MIS transistor with a rising substrate/gate dielectric interface wall wherein on the surface of a semiconductor substrate having a given doping type is formed a first electrically insulating layer surrounding a zone of the substrate surface. On the first insulating layer and on said zone is formed a second layer. Part of that zone is made to appear by eliminating a fragment of the second layer, which fragment extends above that part, which thus constitutes the bottom of a hole made in the second layer and above part of the first insulating layer. A cavity is formed having at least one rising wall in the bottom of the hole. A third electrically insulating layer is formed on the surface of the aforesaid zone part. On the thus treated surface is formed an electrically conductive layer which eliminated, except in a zone corresponding to the fragment, so as to obtain a transistor gate. The remainder of the second layer is eliminated and the transistor source and drain zones are formed, the drain zone being located on the side of the rising wall.

8 Claims, 7 Drawing Sheets

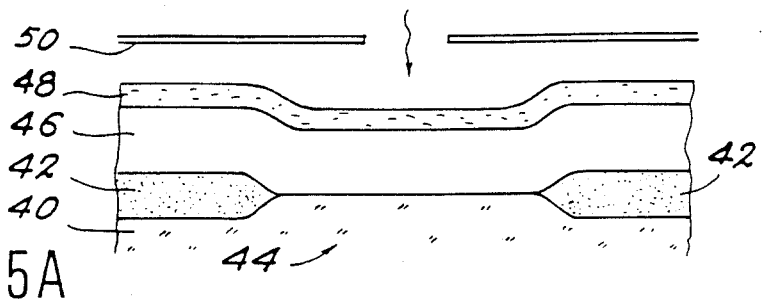
FIG. 5A
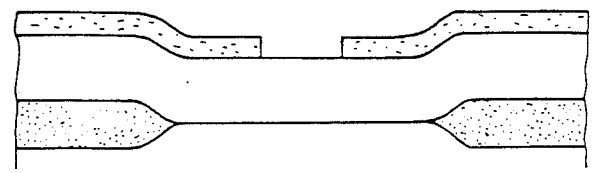
FIG. 5B
FIG. 5C
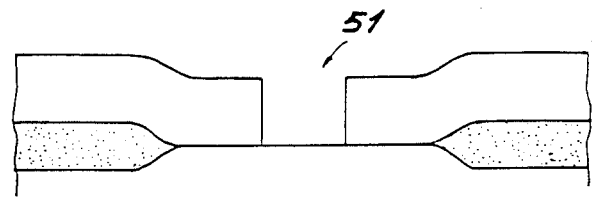
FIG. 5D
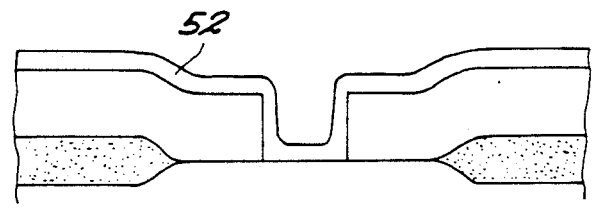
FIG. 5E
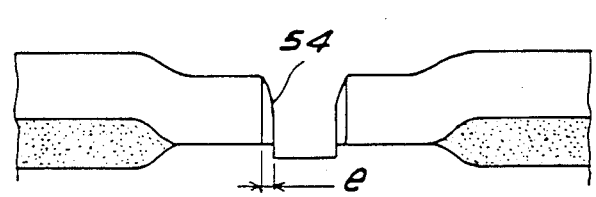
FIG. 5F
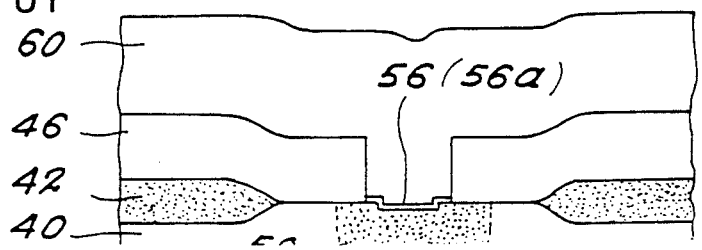

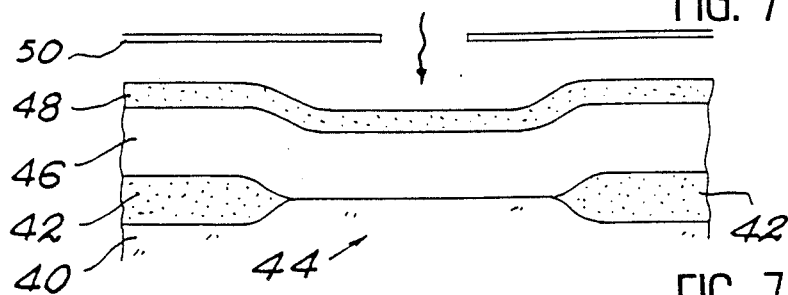
FIG. 7A
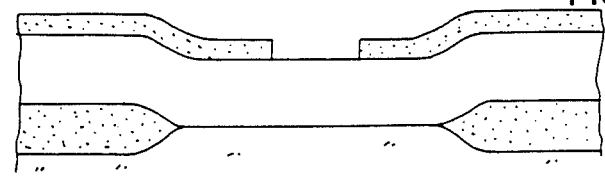
FIG. 7B
FIG. 7C
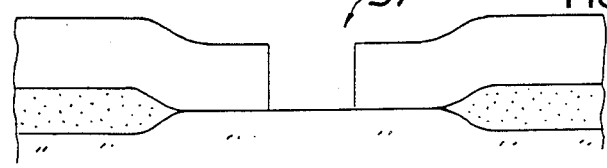
FIG. 7D
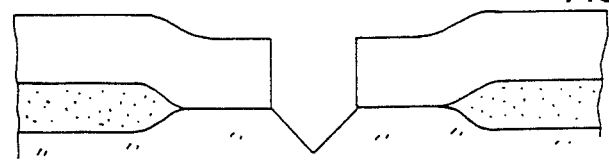
FIG. 7E
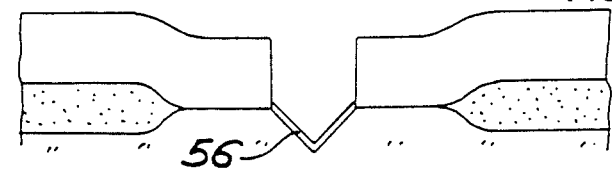
FIG. 7F
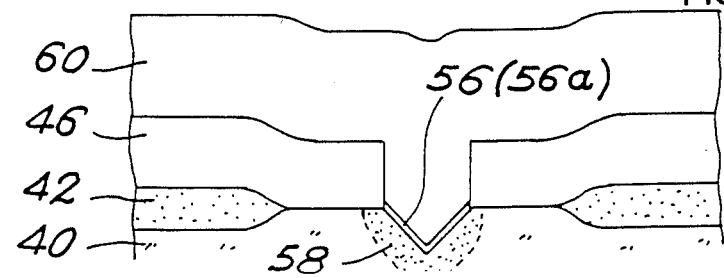

PROCESS FOR THE PRODUCTION OF A MIS TRANSISTOR WITH A RAISED SUBSTRATE/GATE DIELECTRIC INTERFACE END

BACKGROUND OF THE INVENTION

The present invention relates to MIS transistors (metal-insulator-semiconductor) and in particular MOS transistors (metal-oxide-semiconductor) and more specifically a process for the production of a MIS transistor with a raised substrate/gate dielectric interface end.

It is applicable to the production of submicron MOS transistors (whose dimensions do not exceed approximately 1 micrometer) and therefore to the production of integrated circuits resulting from very large scale integration (VLSI).

Very large scale integration of MOS transistors makes it necessary to reduce the dimensions of these transistors and particularly the length of their channels. However, the reduction of the length of the channel of a MOS transistor causes aging problems with respect thereto. Thus, the transistor deteriorates over a period of time and this is more pronounced as the channel length decreases and particularly when it operates in the saturation state, due to electrons in the channel brought into a very high energy form by intense electric fields produced in the channel close to the drain of the transistor (assumed to be a N channel), said electrons being called "hot electrons" and cause transistor deterioration. Thus, these electrons are injected into the gate dielectric and disturb the operation of the transistor. As the channel length decreases, the electric fields become more intense.

In the same way, a P channel MOS transistor deteriorates during time due to the holes in the channel (said holes in this case constituting the minority carriers), which are brought into a very high energy state by intense electric fields close to the transistor drain, when the transistor operates in the saturation state.

Various methods have already been proposed for solving these problems. One of the most widely used methods is the LDD or lightly doped drain method, which is in particular referred to in the article by S. Bampi et al, published in IEDM 85, 9.2, IEEE, 1985, pp. 234 to 237.

FIG. 1 diagrammatically illustrates the LDD method. In a MOS transistor having a substrate 2, a gate 4 separated from the substrate by a dielectric layer 6 having a planar interface with the substrate 2, as well as a source 8 and a drain 10 having portions extending beneath said interface, portion 12 corresponding to the drain 10 is only lightly doped compared with the remainder of the drain.

LDD reduces the maximum value of the electric field close to the drain. However, it introduces an electric resistance in series with the transistor channel, which is prejudicial to the transformer performance characteristics.

Other known methods, optionally combined with the LDD method, make it possible to pass the electron current (assuming that it is a N channel MOS transistor) in depth close to the drain, in such a way that the "hot electrons" are produced remote from the substrate/dielectric interface, where they can be trapped. A depth increase of 10 nanometers of the electron current makes it possible to bring about a ten times less rapid deterioration of the dielectric.

An example of these other methods is also given in the aforementioned article and is diagrammatically illustrated in FIG. 2. In the MOS transistor shown, substrate 2 is e.g. of the P− type and, beneath the planar dielectric/substrate interface is located a type P zone 14 connecting source 8 to drain 10. Beneath said interface, the drain 10 comprises, starting from zone 14, a type N− portion 16 and a type N+ portion 18 and a type P+ zone 20 between said portions 16 and 18.

However, the MOS transistor diagrammatically shown in FIG. 2 suffers from the disadvantage of it being difficult to reduce its size (while obviously maintaining its proportions), because in particular it is difficult to produce a small zone 20.

SUMMARY OF THE INVENTION

The present invention is specifically directed at a process for the production of a MIS, particularly MOS transistor, in which the minority carrier current is remote from the substrate/gate dielectric interface, close to the drain, in the saturation state (it being in the saturation state that intense electric fields are observed and "hot minority carriers" are generated close to the drain), whose dimensions can be reduced and which does not have a resistance in series with the channel of said transistor.

Contrary to certain known methods, in a transistor obtained according to the invention, the minority carrier current is not deflected remote from the substrate/gate dielectric interface by special doping profiles (cf. description of FIG. 2), but said interface has a geometrical shape avoiding the need for having a surface current close to the drain.

Thus, the present invention makes it Possible to obtain a MIS transistor comprising a semiconductor substrate with one given doping type, on said substrate, an electrically conductive element for constituting the transistor gate, which is electrically insulated from the substrate by a dielectric layer, which consequently has an interface with the substrate and in said substrate, on either side of the gate, two zones for respectively constituting the drain and source of the transistor and having a doping type opposite to that of the substrate, said zones respectively incorporating portions extending beneath said interface, the latter thus having two ends passing along the substrate to then extend above those portions, at least one of the said interface ends being raised with respect to the remainder of said interface, the zone located on the side of said raised end serving to constitute the transistor drain.

In a MOS transistor in the ohmic state, (the potential Vd applied to the drain being lower in absolute value), the minority carrier current is a surface current in the inversion layer of the operating transistor. In the saturation state, this inversion layer disappears close to the drain. The minority carriers (electrons in the case of a type P substrate) are then accelerated by the electric field existing in the vicinity of the drain, but are no longer controlled by the gate.

In a transistor according to the invention, at least the end of the dielectric/substrate interface located on the side of the drain is higher than the rest of said interface and the minority carriers continue in the saturation state their displacement in the direction of the drain, while following the electric field and independently of the proximity of the gate. Thus, these minority carriers encounter the zone of the drain in the vicinity of which there is a maximum electric field and are remote from said interface. The minority carrier current in the inversion layer follows said interface, even if the latter is not planar, on the side of the source no matter what the state and on the side of the drain only in the ohmic state.

Thus, the structure of the transistor according to the invention introduces no electrical resistance in series with the channel on the side of the source (or on the side of the drain, for a potential Vd applied to the drain and which is low in absolute values), unlike in LDD methods.

It is preferable for the two ends of the interface to be raised with respect to the remainder of said interface. The transistor can then have a symmetrical structure, the zones corresponding to the source and the drain being identical and therefore interchangeable, which can be very important for facilitating the manufacture of such a transistor and particularly the connections in integrated circuits using several of such transistors.

It is apparent that the process according to the invention lends itself particularly well to the manufacture of a small transistor, because a height difference of a few dozen nanometers between said interface end and the remainder of said interface is adequate. Therefore the invention can apply to the manufacture of transistors smaller than 0.5 micrometer. All known methods using doping profile variations are much more limited from the size reduction standpoint, because the attainable doping gradients are limited.

The present invention makes it possible to obtain a MIS transistor, in which each raised end is shaped like a step, or a MIS transistor in which each raised end is shaped like a ramp, or a MIS transistor in which there are two raised ends constituting, between the two zones, the two faces of a dihedron, whose concavity is turned towards the gate, said zones being located on either side of the bisector plane of said dihedron, the remainder of the interface then being substantially reduced to a line corresponding to the edge of the dihedron.

More specifically, the present invention relates to a process for the production of a MIS transistor, characterized in that it comprises the following successive stages:

on the surface of a semiconductor substrate having a given doping type is formed a first electrically insulating layer, which surrounds a surface zone of the substrate, on the first insulating layer and on said zone is formed a second layer, part of said zone is made to appear by eliminating a fragment of the second layer, said fragment extending above said part, which thus constitutes the bottom of a hole made in the second layer, and above a part of the first insulating layer, a cavity or recess having at least one rising wall is formed in the bottom of said hole, a third electrically insulating layer is formed on the surface of said part of said zone, an electrically conductive layer is formed on the substrate, elimination of the conductive layer takes place except in a zone corresponding to said fragment, so as to obtain the transistor gate by etching back of the electrically conductive layer, the remainder of the second layer is eliminated and on either side of the gate are formed the source and drain zones of the transistor in such a way that said source and drain zones respectively have portions extending beneath the interface which the third layer has with the substrate, the source and drain zones having a doping type opposite to that of the substrate, the drain zone being located on the side of said rising walls of the cavity wherein before or after forming the third insulating layer, ions giving rise to a doping of the same type as that of the substrate are locally implanted in the substrate in a zone thereof which corresponds to a transistor channel, under the third insulating layer.

According to a special embodiment of the inventive process, said cavity or recess has at least one wall substantially perpendicular to the bottom of the cavity or recess, said wall corresponding to said rising wall of the cavity (in such a way that the rising wall or walls of the subsequently produced substrate/gate dielectric interface are in the form of a step).

In this case, the cavity can be formed by the successive stages of forming a protective layer on the substrate provided with said hole, the elimination of said protective layer, except on at least the side or sides of said hole corresponding to the wall or walls of the cavity to be raised, a substrate thickness is eliminated at the bottom of said hole and the remainder of the protective layer is eliminated.

According to another special embodiment of the inventive process corresponding to the case where the cavity has two rising walls, said cavity has two walls inclined with respect to the bottom of the cavity, said walls corresponding to said rising walls of the cavity (in such a way that the two rising walls of the subsequently formed substrate/gate dielectric interface are in the form of a ramp).

In this case, the cavity can be performed by the successive stages of forming a protective layer on the substrate provided with said hole, the elimination of said protective layer, except on at least the sides of the hole corresponding to the walls of the cavity to be raised, the oxidation of the substrate at the bottom of said hole and the elimination of the thus oxidized portion of the substrate and the remainder of the protective layer.

To this end, with the second layer being in the form of a double layer having an underlayer surmounted by a first protective layer, the cavity can be formed by the successive stages of forming a second protective layer on the substrate provided with said hole, the elimination of said second protective layer, except on at least the sides of the hole corresponding to the walls of the cavity to be raised, the oxidation of the semiconductor substrate at the bottom of said hole and the elimination of the thus oxidized part of the substrate, the remainder of the second protective layer and the remainder of the first protective layer.

According to another special embodiment corresponding to the case where the cavity has two rising walls, said cavity has two walls forming the faces of a dihedron and which correspond to the two rising walls of the cavity. In this case, the cavity can be formed by etching the bottom of the hole selectively in accordance with the appropriate crystal planes leading to said dihedron.

BRIEF DESCRIPTION OF THE DRAWINGS

The invention is described in greater detail hereinafter relative to non-limitative embodiments and with reference to the attached drawings, wherein show:

FIGS. 5A to 5I diagrammatically different stages of a process according to the invention making it possible to manufacture a transistor of the type shown in FIG. 3.

FIGS. 7A to 7I diagrammatically different stages of another process according to the invention permitting the manufacture of a transistor having a dihedron-shaped substrate/gate dielectric interface.

DESCRIPTION OF THE PREFERRED EMBODIMENTS

Figure 1:
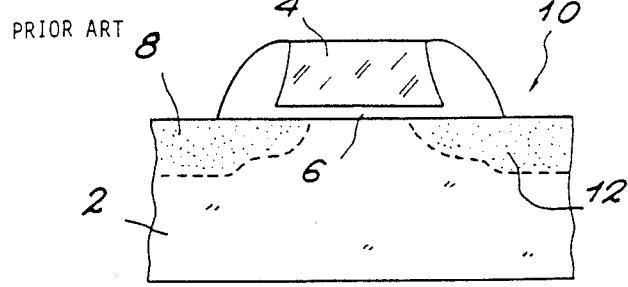
FIGS. 1 and 2 diagrammatic views of known and already described MOS transistors.
Figure 2:
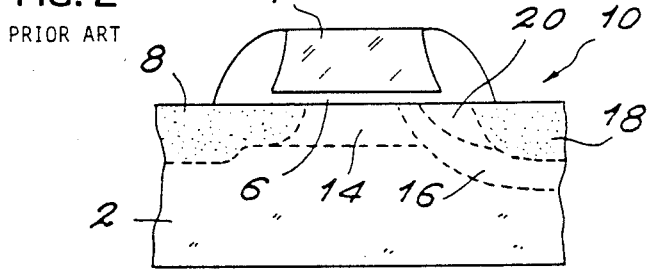
Figure 3:
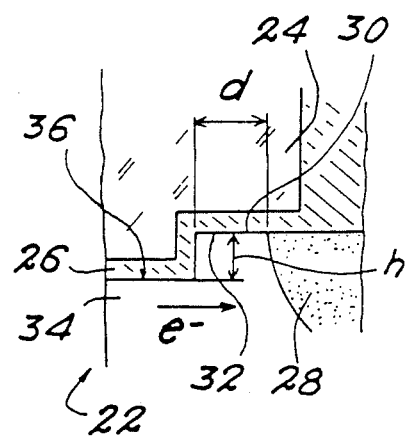
FIG. 3 a diagrammatic, partial view of a first transistor obtainable according to a process according to the invention.

FIG. 3 diagrammatically and partially shows a first MIS transistor which can be produced by a process according to the invention. The transistor comprises an e.g. type P monocrystalline silicon substrate 22, an e.g. polycrystalline silicon gate 24 appropriately doped to be electrically conductive, said gate 24 being placed above said substrate, an e.g. silica dielectric layer 26 extending between the gate and the substrate, as well as a type N+, in the present example, zone 28 for forming the transistor drain.

Part of the zone 28 is located beneath the interface existing between the dielectric layer 26 and the substrate 22 and said interface consequently has an end 30 passing along the substrate and above the part of zone 28. This end forms a rising step 32, the same applying with regards to layer 26 at this point. The drain zone 28 thus extends higher than the zone 34 corresponding to the transistor channel.

In a purely indicative and non-limitative manner, the height of step h is approximately 50 to 100 nm, the drain zone 28 extends in the substrate to a depth of approximately 200 to 300 nm and the minimum distance d between drain zone 28 and the step part perpendicular to the remainder 36 of the interface is approximately 100 to 200 nm.

Another zone corresponding to the transistor source and of type N+ in the present example is not shown in FIG. 3. This other zone positioned opposite to zone 28 with respect to the channel zone 34 is partly located beneath said interface.

When the transistor operates in the saturation state, the electrons traverse the channel in the direction of the drain zone, parallel to the interface (in the present case parallel to the substantially planar remainder 36 of the interface) and then continue their path in a straight line following the electric field, whilst moving away from the interface, when they are in the vicinity of the drain zone where the electric field is at a maximum.

Figure 4:
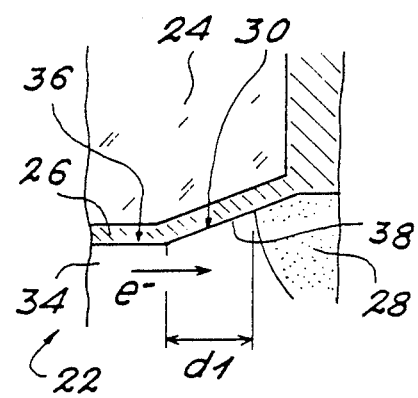
FIG. 4 a diagrammatic, partial view of a second transistor obtainable by another inventive process.

FIG. 4 diagrammatically and partly shows a second MIS transistor which can be produced by another process according to the invention and which differs from the first transistor described relative to FIG. 3 by the fact that the rising step 32 is replaced by a rising ramp 38, so that once again the drain zone portion located beneath the interface end 30 is higher than the zone corresponding to the transistor channel, so that the electrons are further from the interface, in said end, when they are in the vicinity of the drain.

In a purely indicative and non-limitative manner, the ramp has a slope of approximately 30° to 45°, the drain zone 28 extends in the substrate up to a depth of approximately 200 to 300 nm and the minimum distance d1 between drain zone 28 and the start of the ramp is approximately 150 to 300 nm.

The transistor of FIGS. 3 or 4 could have a symmetrical structure with respect to the plane perpendicular to the plane of the drawing and mid-point with respect to channel zone 34.

FIGS. 5A to 5I show diagrammatically different stages of a process according to the invention permitting the manufacture of a MOS transistor of the type described relative to FIG. 3 and which has the said symmetrical structure.

The starting point is an e.g. type P monocrystalline silicon substrate 40 with a concentration of approximately $10^{16}$ atoms per $cm^3$ in exemplified manner (FIG. 5A). On said substrate 40 is produced in the conventional manner a $SiO_2$ field oxide 42 around a zone 44 of the substrate surface and which is called the "active zone" and in which it is wished to create the transistor. On the substrate is then formed an e.g. approximately 500 nanometer thick "sacrificial" layer 46, by e.g. low pressure vapor chemical deposition (LPCVD).

A fragment of layer 46 is then eliminated at the point where it is wished to produce the transistor gate, said fragment extending above a portion of the active zone and also above a part of the field oxide 42, perpendicular to FIG. 5A and on either side of said portion seen in plan view, because the gate to be produced extends not only above said portion, but also above part of the field oxide, perpendicular to FIG. 5A and on either side of said portion seen in plan view (cf. hereinafter).

In order to eliminate said fragment, it is possible to proceed in the following manner. On the surface of layer 46 is deposited an e.g. 1.4 micrometer thick positive photosensitive resin layer 48. Said resin is irradiated by an appropriate light through a mask 50 having an opening to define said gate (said opening e.g. being in the form of a rectangle, which is located above the active zone and which projects over the field oxide in a plane perpendicular to FIG. 5A, whereby the width of the rectangle is e.g. approximately 0.8 micrometer-the energy values and doses of the ion implantations indicated in the remainder of the process being given for said gate width). This is followed by the elimination of the irradiated part of the resin (FIG. 5B). This is followed by the removal of the portion of layer 46 limited by the remaining resin, e.g. by reactive ionic etching using $CHF_3$ (FIG. 5C), which produces a hole 51 having two opposite, vertical sides and also having as its bottom said active zone portion. The remaining resin layer 48 is then eliminated by chemical etching or by an oxygen plasma.

This is followed by the deposition on the entire surface of the substrate resulting from what has been stated hereinbefore of a $Si_3N_4$ layer 52, whose thickness is e.g. 200 nanometer and using low pressure vapor chemical deposition (FIG. 5D).

This is followed by anisotropic etching of said layer 52, e.g. by reactive ionic etching using $SF_6$, in such a way that the vertical sides of the hole 51 remain covered by a thickness 54 of $Si_3N_4$ and said thickness e can be approximately 200 nm.

This is followed by etching of the silicon of the substrate defined by the thickness 54 over a depth of e.g. 50 nanometers (FIG. 5E). Etching is carried out selectively with respect to layer 46 and the field oxide 42, e.g. by prolonging the preceding reactive ionic etching carried out by means of $SF_6$.

The remaining $Si_3N_4$ thickness 54 is then eliminated e.g. by means of phosphoric acid. This is followed (FIG. 5F) by the oxidation of the substrate at the location of the etching in order to obtain an e.g. 20 nanometer thick silica layer 56, after which there is advantageously a P type doping by standard $BF_2$ ionic implantation (through layer 56) of the zone 58 corresponding to the transistor channel, the energy of the implantation being 50 keV and the dose approximately $10^{12}$ atoms/$cm^2$. This is followed by the deposition on the entire substrate of a polycrystalline silicon layer 60, whose thickness is e.g. 800 nanometers. This is followed by a standard $N^+$ doping of layer 60 using $POCl_3$, in order to make this polycrystalline silicon electrically conductive.

According to an advantageous variant, following the implantation of zone 58 for doping the transistor channel and prior to the deposition of the polycrystalline silicon layer 60, elimination of the silica layer 56 takes place (chemically using dilute HF), followed by again oxidizing the substrate 40, in order to form the gate oxide, which gives an e.g. 20 nm thick silica layer 56a.

Figure 5G:
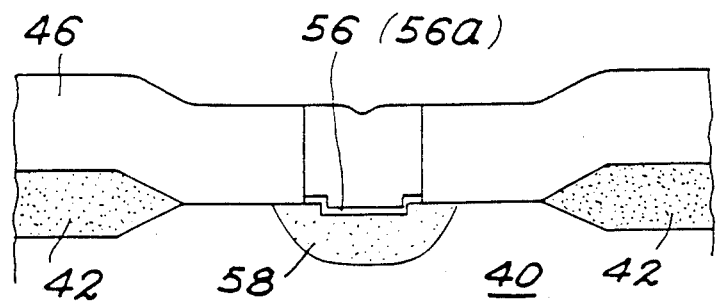
Figure 5H:
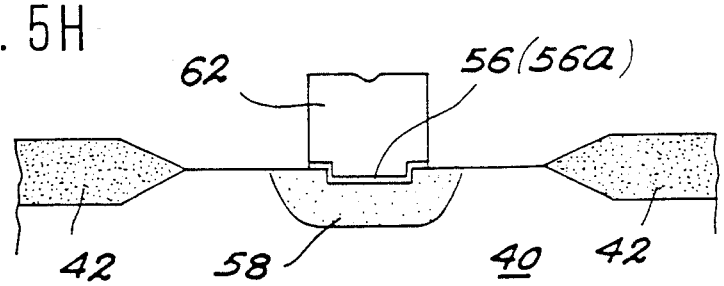

After doping layer 60, a "solid plate" etching takes place of layer 60 using reactive ionic etching by means of $SF_6$. Etching is stopped when the silica layer 46 is exposed, so that the transistor gate 62 is obtained (FIG. 5G). This is followed by the elimination of the silica layer 46, e.g. by reactive ionic etching with $CHF_3$ (FIG. 5H).

Figure 5I:
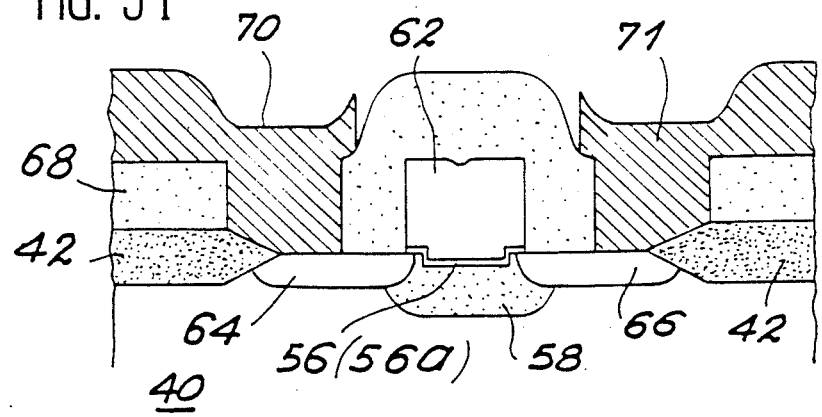

The production of the transistor is then completed in the conventional way (FIG. 5I). For example by ionic implantation in the substrate defined by the field oxide and the gate 62, there is a N-type doping of zones 64 and 66 of the substrate intended to respectively constitute the transistor source and drain, each zone 64 or 66 extending over a depth of e.g. 250 nm and doping being carried out by arsenic ionic implantation at 100 keV with a dose of e.g. $5 \times 10^{15}$ atoms/$cm^2$. Then annealing takes place at 850° C. for 30 minutes in order to activate the implanted dopants.

This is followed by the deposition on the entire substrate of a layer 68 of an insulator or insulant, such as silica, e.g. by low pressure chemical vapor deposition with a thickness of e.g. 600 nanometers. Layer 68 is then etched with a view to obtaining gate, source and drain contacts and said contacts 70,71 are produced by metallization. As the gate contact is not in the same plane as the source and drain contacts, it is not shown in FIG. 5I.

The thus obtained transistor has a symmetrical structure. To obtain a transistor with an asymmetrical structure (substrate/gate dielectric interface only having a step on the side of the transistor drain), it would e.g. be sufficient, after obtaining the thickness 54 of $Si_3N_4$ on the two vertical sides of the hole 51, to eliminate said thickness 54 on one of said sides by etching through an appropriate mask, so as to only retain said thickness 54 on the other of the vertical sides. This would be followed by etching of the silicon of the substrate in the manner indicated hereinbefore.

FIGS. 6A to 6K diagrammatically illustrate different stages of another process according to the invention making it possible to manufacture a MOS transistor of the type described relative to FIG. 4 and which has said symmetrical structure.

Figure 6A:
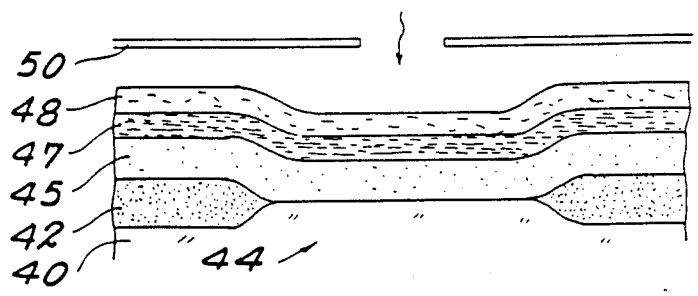
FIGS. 6A to 6K diagrammatically different stages of another process according to the invention making it possible to manufacture a transistor of the type shown in FIG. 4.
Figure 6B:
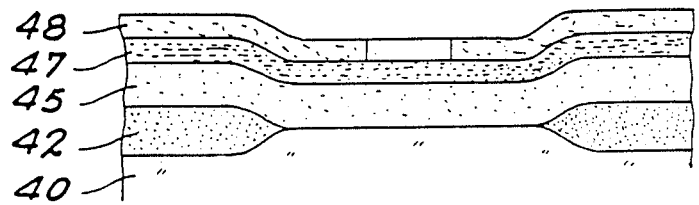
Figure 6C:
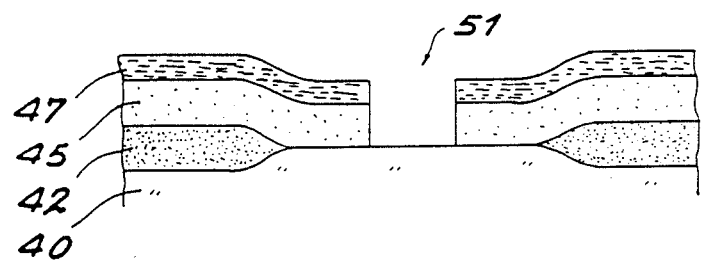

Initially the procedure is the same as explained relative to FIG. 5A. The field oxide 42 is produced on substrate 40 and then, instead of forming layer 46, a double layer 45-47 is produced, namely a "sacrificial" layer 45 of silica with a thickness of e.g. 300 nanometers deposited on the field oxide and on zone 44, said layer 45 being surmounted by a "sacrificial" layer 47 of $Si_3N_4$ e.g. with a thickness of 200 nanometers and obtained by low pressure chemical vapor deposition. Resin layer 48 is then deposited on layer 47 (FIG. 6A) and then irradiated through mask 50 and the irradiated resin is then eliminated. Hole 51 is then formed through the double layer 45-47 (FIGS. 6B and 6C). For this purpose, layers 47 and 45 are successively etched by reactive ionic etching, e.g. using $CHF_3$, above said portion of the active zone and also above the field oxide 42, perpendicular to FIG. 6A, as shown hereinbefore relative to FIG. 5A. The remaining layer 48 is eliminated in the same way as hereinbefore.

Figure 6D:
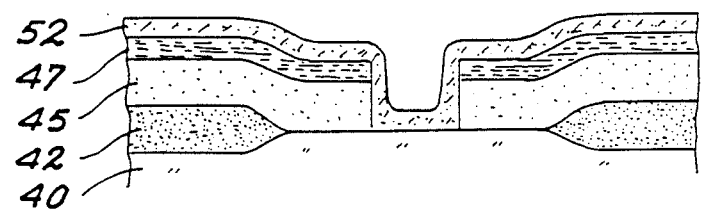
Figure 6E:
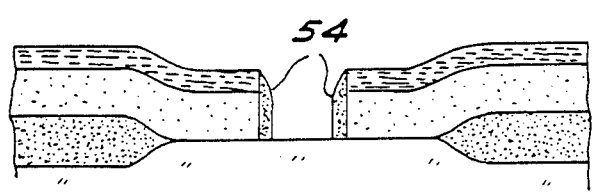

The $Si_3N_4$ layer 52 is then deposited (FIG. 6D). The $Si_3N_4$ layer 52 is then eliminated by anisotropic etching, e.g. reactive ionic etching by means of $CHF_3$, whilst stopping it on reaching layer 47, the anisotropy of the etching leaving on the vertical sides of hole 51 a $Si_3N_4$ thickness identical to thickness 54 in FIG. 5E and carrying the same reference in FIG. 6E.

Figure 6F:
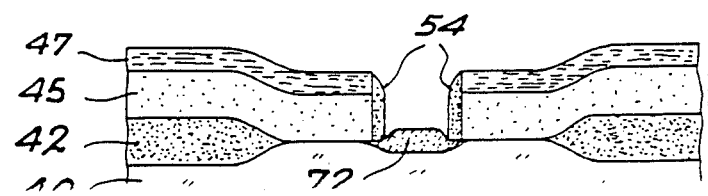
Figure 6G:
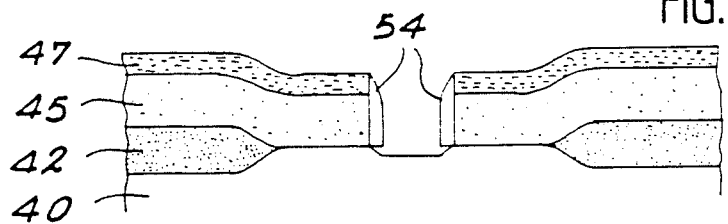
Figure 6H:
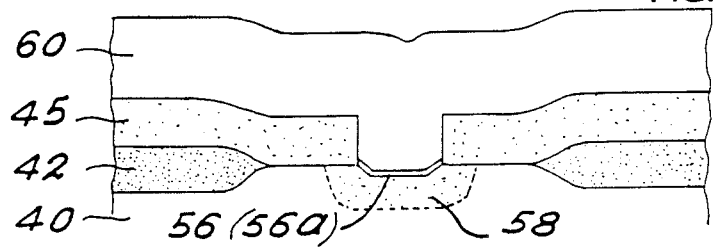
Figure 6I:
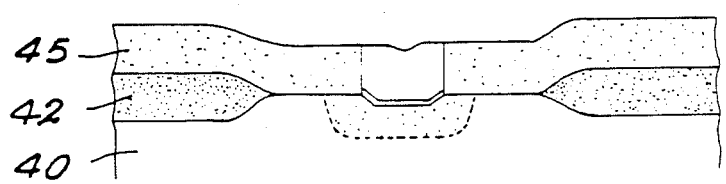
Figure 6J:
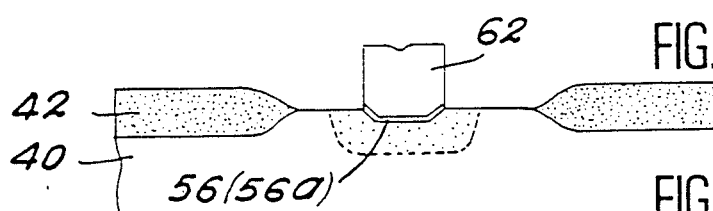
Figure 6K:
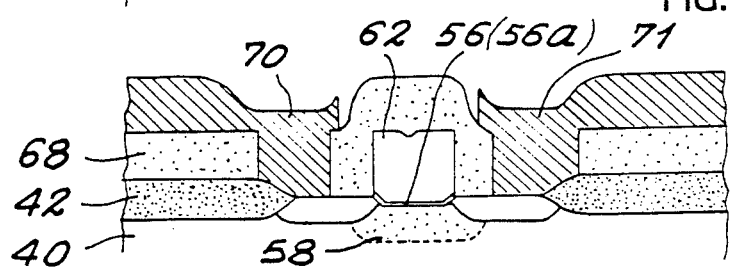
Figure 7G:
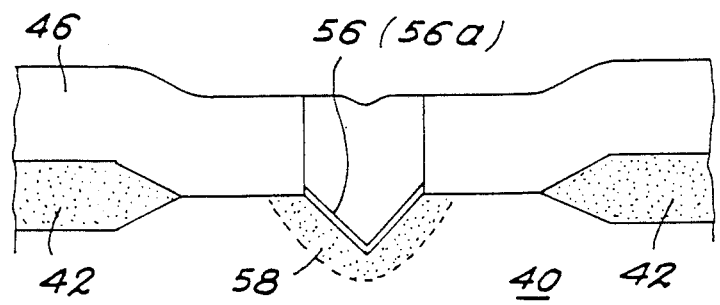
Figure 7H:
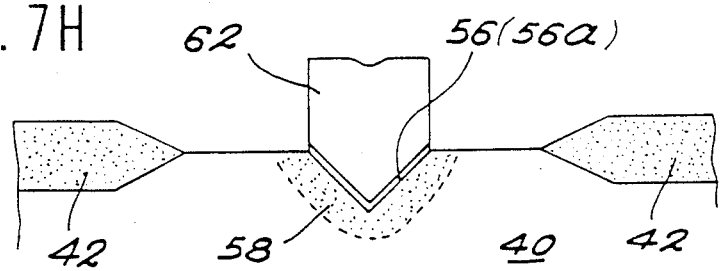
Figure 7I:
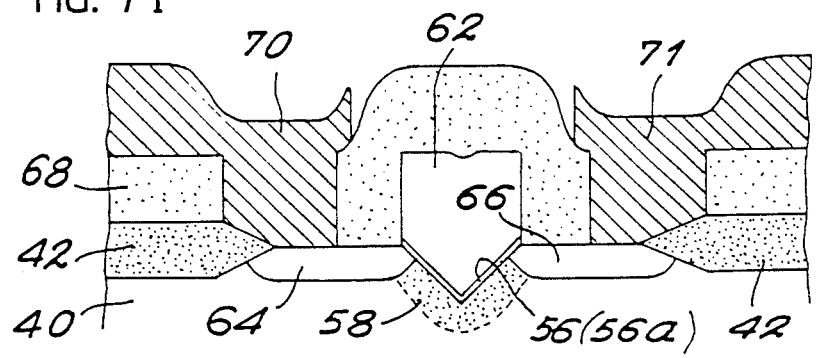

This is followed by thermal oxidation of the substrate present at the bottom of hole 51 to obtain an e.g. 150 nanometer thick silica layer 72 (FIG. 6F). Said silica layer 72 is then removed with e.g. hydrofluoric acid, so that the bottom of the hole consequently has sloping sides making it possible to obtain the desired substrate/gate dielectric interface for the transistor (FIG. 6G).

This is followed by the removal of the remainder of layer 47 and thickness 54 of $Si_3N_4$, e.g. using phosphoric acid, after which the layer 56 is formed, the zone 58 is doped and layer 56 is advantageously eliminated and replaced by the silica layer 56a. Layer 60 is then formed (FIG. 6H), this all taking place in the same way as described in FIG. 5F for the transistor corresponding thereto.

The transistor is then completed (FIGS. 6I to 6K) in the manner described relative to FIGS. 5G to 5I for the transistor corresponding thereto.

FIGS. 7A to 7I diagrammatically illustrate different stages of another inventive process making it possible to manufacture a transistor having a dihedron-shaped substrate/gate dielectric interface. Initially the procedure is the same described as for FIGS. 5A to 5C in order to give the hole 51. Then, instead of depositing layer 52, etching takes place of the silicon at the bottom of said hole, in a selective manner along the crystal planes <111> which form between them angles of approximately 54.7°, e.g. by means of KOH. Thus, said etching directly leads to a dihedron-shaped interface (FIG. 7D) which, seen in cross-section in FIG. 7D, forms a V.

This is followed by oxidation leading to layer 56 (FIG. 7E), the doping of the transistor channel, the formation of layer 56a, the deposition of layer 60, the doping of the latter (FIG. 7F) and the completion of the transistor (FIGS. 7G to 7I) as described relative to FIGS. 5G to 5E for the transistor corresponding thereto.

It should be noted that the examples of the process described relative to FIGS. 5A-5I, 6A-6K and 7A-7I, in each case advantageously lead to a transistor with a symmetrical structure, zone 64 or 66 being able to correspond to the source or drain of the transistor or to the drain or source of said transistor. Moreover, these examples have been given using a P-type semiconductor substrate, but it is obviously possible for the Expert to adapt them to the manufacture of a MIS transistor according to the invention on a type N substrate.

We claim:

1. A process for the production of a MIS transistor, comprising the following successive steps:
    forming on the surface of a semiconductor substrate having a given doping type a first electrically insulating layer which surrounds a surface zone of the substrate;
    forming a second layer on the first insulating layer and on said zone;
    exposing part of said zone by eliminating a fragment of the second layer, said fragment extending about said part, which thus constitutes the bottom of a hole made in the second layer, and above a part of the first insulating layer;
    forming a recess having at least one rising wall in the bottom of said hole;
    forming a third electrically insulating layer on the surface of said part of said zone;
    forming an electrically conductive layer on the substrate;
    eliminating said electrically conductive layer except in a zone corresponding to said fragment, so as to obtain a transistor gate by etching back of the electrically conductive layer;
    eliminating the remainder of the second layer; and
    forming on either side of the gate source and drain zones of the transistor in such a way that said source and drain zones respectively have portions extending beneath the interface which the third layer has with the substrate, the source and drain zones having a doped type opposite to that of the substrate, the drain zone being located on the side of said rising wall of the recess, wherein, before or after forming the third insulating layer, ions giving rise to a doping of the same type as that of the substrate are locally implanted in the substrate in a zone thereof which corresponds to a transistor channel, under the third insulating layer.

2. The process according to claim 1 wherein said rising wall is substantially perpendicular to the bottom of the recess.

3. The process according to claim 2 wherein the recess is formed by the successive steps of
    forming a protective layer on the substrate provided with said hole;
    eliminating said protective layer except on at least the side or sides of said hole corresponding to the rising wall or walls of the recess;
    eliminating a substrate thickness at the bottom of said hole and eliminating the remainder of the protective layer.

4. The process according to claim 1 wherein said recess has two rising walls which are inclined with respect to the bottom of the recess.

5. The process according to claim 4 wherein the recess is formed by the successive steps of
    forming a protective layer on the substrate provided with said hole;
    eliminating said protective layer except on at least the aides of said hole corresponding to the walls of the recess;
    oxidizing the substrate at the bottom of said hole; and
    eliminating the thus oxidized part of the substrate and the remainder of the protective layer.

6. The process according to claim 4 wherein the second layer is a double layer having an underlayer surmounted by a first protective layer and wherein the recess is formed by the successive steps of
    forming a second protective layer on the substrate provided with said hole;
    eliminating said second protective layer except on at least the sides of said hole corresponding to the walls of the recess;
    oxidizing the substrate at the bottom of said hole; and
    eliminating the thus oxidized part of the substrate, the remainder of the second protective layer and the remainder of the first protective layer.

7. The process according to claim 1 wherein said recess has two rising walls which form the faces of a dihedron.

8. The process according to claim 7 wherein the recess is formed by etching the bottom of said hole selectively in accordance with appropriate crystal planes leading to said dihedron.

* * * * *